United States Patent
Nakamura

(10) Patent No.: US 11,522,533 B2
(45) Date of Patent: Dec. 6, 2022

(54) SEMICONDUCTOR DEVICE

(71) Applicant: Mitsubishi Electric Corporation, Tokyo (JP)

(72) Inventor: Hiroyuki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 188 days.

(21) Appl. No.: 16/793,111

(22) Filed: Feb. 18, 2020

(65) Prior Publication Data
US 2020/0373920 A1    Nov. 26, 2020

(30) Foreign Application Priority Data

May 21, 2019  (JP) .............................. JP2019-095061

(51) Int. Cl.
*H01L 23/00* (2006.01)
*H03K 17/082* (2006.01)
*H03K 17/74* (2006.01)

(52) U.S. Cl.
CPC ......... *H03K 17/0826* (2013.01); *H01L 24/45* (2013.01); *H03K 17/74* (2013.01); *H01L 2924/13055* (2013.01)

(58) Field of Classification Search
CPC ......... H01L 23/49562; H01L 23/49575; H01L 23/3107; H01L 23/4952; H01L 23/00; H01L 24/06; H01L 24/45; H01L 24/48; H01L 24/49; H01L 2224/0603; H01L 2224/45099; H01L 2224/48095; H01L 2224/48137; H01L 2224/48139; H01L 2224/48247; H01L 2224/48472; H01L 2224/4903; H01L 2224/49111;
(Continued)

(56) References Cited

U.S. PATENT DOCUMENTS

2002/0050633 A1* 5/2002 Matsumoto ............ H01L 23/64
257/784
2010/0013085 A1    1/2010 Oi et al.
(Continued)

FOREIGN PATENT DOCUMENTS

DE    102 29 625 A1    5/2003
JP    2002314038 A * 10/2002 ... H01L 2224/45015
(Continued)

OTHER PUBLICATIONS

An Office Action; "Notice of Reasons for Refusal", mailed by the Japanese Patent Office dated Apr. 5, 2022, which corresponds to Japanese Patent Application No. 2019-095061 and is related to U.S. Appl. No. 16/793,111; with English language translation.

*Primary Examiner* — Timothy J Thompson
*Assistant Examiner* — Guillermo J Egoavil
(74) *Attorney, Agent, or Firm* — Studebaker & Brackett PC

(57) ABSTRACT

Provided is a semiconductor device capable of suppressing increase in size of a package and adjusting an amount of negative feedback. A power module as a semiconductor device includes an IGBT which is a switching element and a free wheel diode (FWD) parallelly connected to the switching element. The IGBT has, on a surface thereof, an emitter electrode and a gate electrode of the IGBT and a conductive pattern insulated from the emitter electrode and the gate electrode. The FWD has, on a surface thereof, an anode electrode of the FWD and a conductive pattern insulated from the anode electrode.

9 Claims, 5 Drawing Sheets

(58) Field of Classification Search
CPC . H01L 2224/49175; H01L 2924/00012; H01L 2924/00014; H01L 2924/1203; H01L 2924/13055; H01L 2924/13091; H01L 2924/14; H01L 2924/181; H03K 17/0826; H03K 17/0828; H03K 17/74; H03K 17/082; H03K 17/08
USPC .......................... 361/100; 257/700, 685, 693
See application file for complete search history.

(56) References Cited

U.S. PATENT DOCUMENTS

| | | |
|---|---|---|
| 2013/0155745 A1 | 6/2013 | Tanaka et al. |
| 2016/0057867 A1* | 2/2016 | Yamauchi .............. H05K 3/027 427/535 |
| 2019/0058468 A1* | 2/2019 | Okayama ............. H03K 17/567 |

FOREIGN PATENT DOCUMENTS

| | | | | |
|---|---|---|---|---|
| JP | 2003142689 A | * | 5/2003 | ............. H01L 24/06 |
| JP | 2010-027814 A | | 2/2010 | |
| JP | 2010205758 A | * | 9/2010 | ... H01L 2224/48247 |
| JP | 2013-125806 A | | 6/2013 | |
| JP | 2014-120563 A | | 6/2014 | |

\* cited by examiner

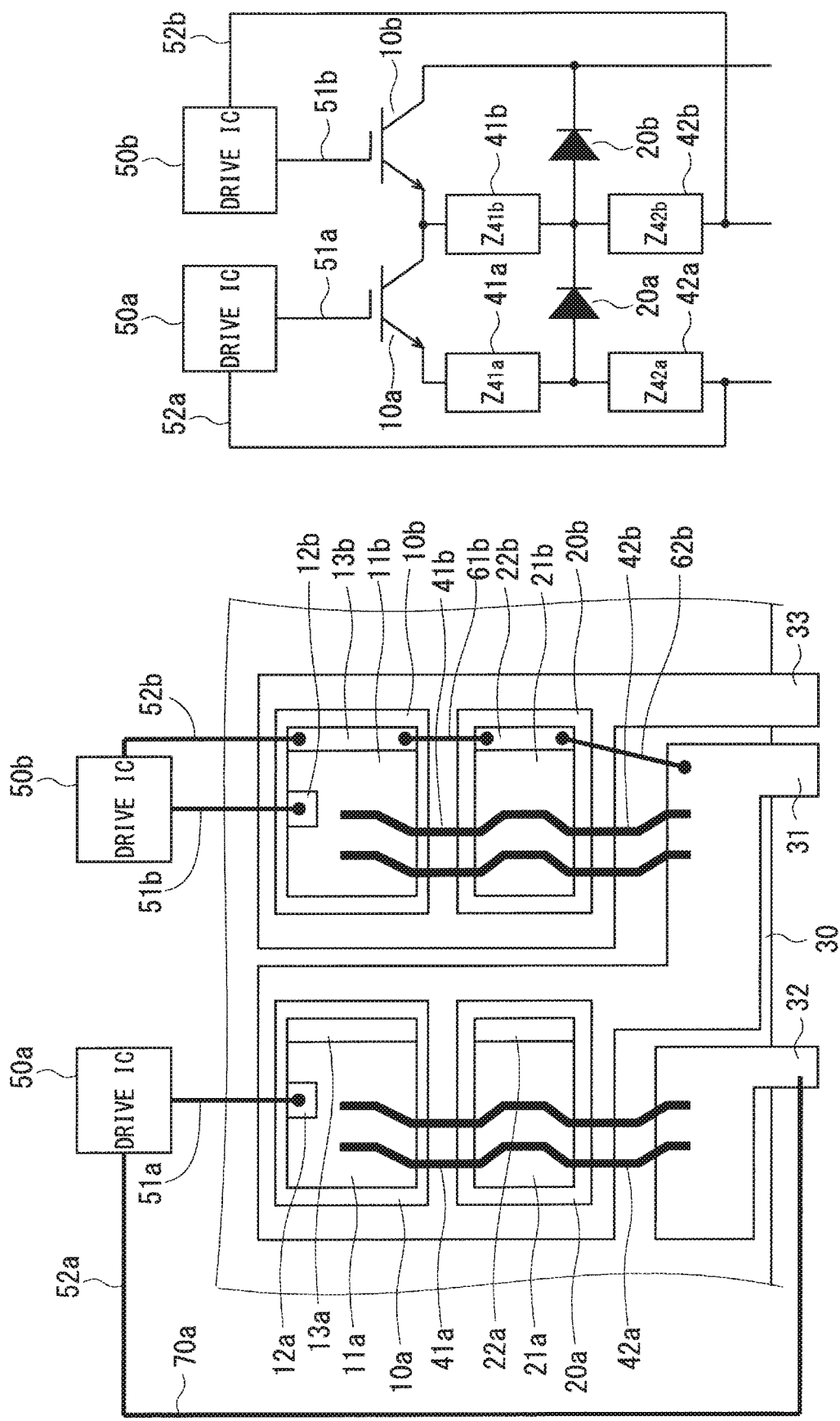

SEMICONDUCTOR DEVICE

FIELD OF THE INVENTION

The present invention relates to a semiconductor device, and particularly to a power semiconductor device.

DESCRIPTION OF THE BACKGROUND ART

Known in a power semiconductor device including a switching element such as an insulated gate bipolar transistor (IGBT), for example, is a technique of reducing current flowing between a collector and an emitter at a time of a short circuit of a connected load, thereby protecting the switching element from overcurrent.

For example, Japanese Patent Application Laid-Open No. 2014-120563 discloses a semiconductor device including "a negative feedback circuit" making a voltage drop occurring by a flow of current in an emitter wiring in the IGBT feed back to a gate of the IGBT. In the semiconductor device in Japanese Patent Application Laid-Open No. 2014-120563, the negative feedback circuit is made up by connecting a reference potential wiring of a drive circuit controlling the IGBT to the emitter wiring. In the semiconductor device in Japanese Patent Application Laid-Open No. 2014-120563, a terminal for connecting the reference potential wiring of the drive circuit is provided in a plurality of positions in the emitter wiring, and an amount of negative feedback is adjusted by selecting the terminal connecting the reference potential wiring.

In the meanwhile, in a transfer molding type semiconductor device (a power module), there is a possibility that the reference potential wiring causes interference with a wire flowing a main current of the IGBT when the wire of the reference potential wiring of the drive circuit is connected to a free wheel diode (FWD) to constitute a negative feedback circuit. A lead frame or a wiring substrate for connecting the reference potential wiring may be separately provided to prevent such interference between the wires, however, this configuration causes a problem that a package of the power module upsizes.

For example, Japanese Patent Application Laid-Open No. 2013-125806 discloses a technique of providing an electrode for a gate wiring on a surface of each chip in a semiconductor device including a plurality of chips of the switching elements to achieve wiring on a chip located away from a drive circuit via a gate wiring on the other chip as a technique of preventing interference between the wires.

SUMMARY

As described above, when the negative feedback circuit is mounted on the transfer molding type power module, the suppression of the increase in size of the package and the adjustment of the amount of the negative feedback for obtaining a desired negative feedback function should be problems to be solved.

It is an object of the present invention to provide a semiconductor device capable of suppressing increase in size of a package and adjusting an amount of negative feedback.

The semiconductor device according to the present invention includes switching element and a free wheel diode parallelly connected to the switching element. The switching element has a first conductive pattern insulated from a main electrode and a control electrode of the switching element on a surface of the switching element. The free wheel diode has a second conductive pattern insulated from a main electrode of the free wheel diode on a surface of the free wheel diode.

According to the semiconductor device according to the present invention, when a reference potential wiring of a drive IC is connected to a main electrode of a free wheel diode and an external connection terminal to adjust an amount of negative feedback (adjust a level of a negative feedback effect), the connection is established via a first conductive pattern and a second conductive pattern, thus interference between a wire of the reference potential wiring and the other wire can be prevented. Thus, a lead frame, for example, for preventing the interference between the wires needs not be separately provided, and increase in size of the semiconductor device can be suppressed.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5A and 5B are diagrams each illustrating a configuration example of a power module according to an embodiment 2.

DESCRIPTION OF THE PREFERRED EMBODIMENTS

Embodiment 1

Figure 1C:
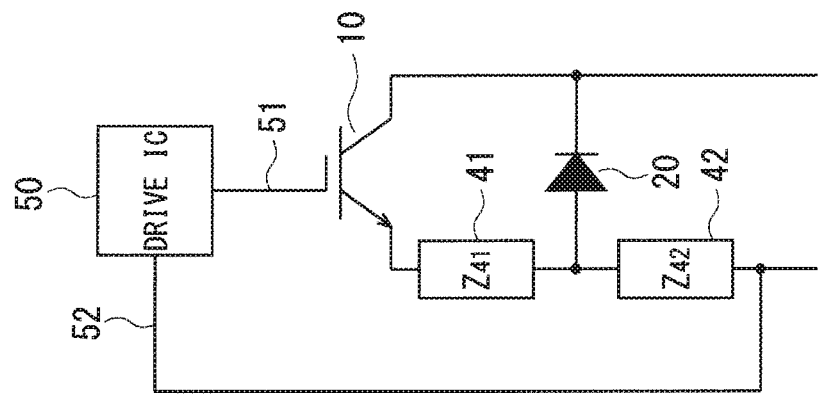
FIGS. 1A to 1C are diagrams each illustrating a configuration example of a power module according to an embodiment 1.
Figure 1B:
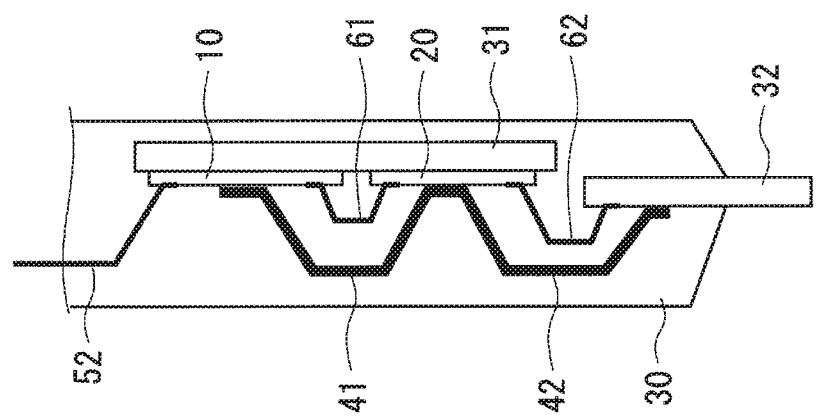
Figure 1A:
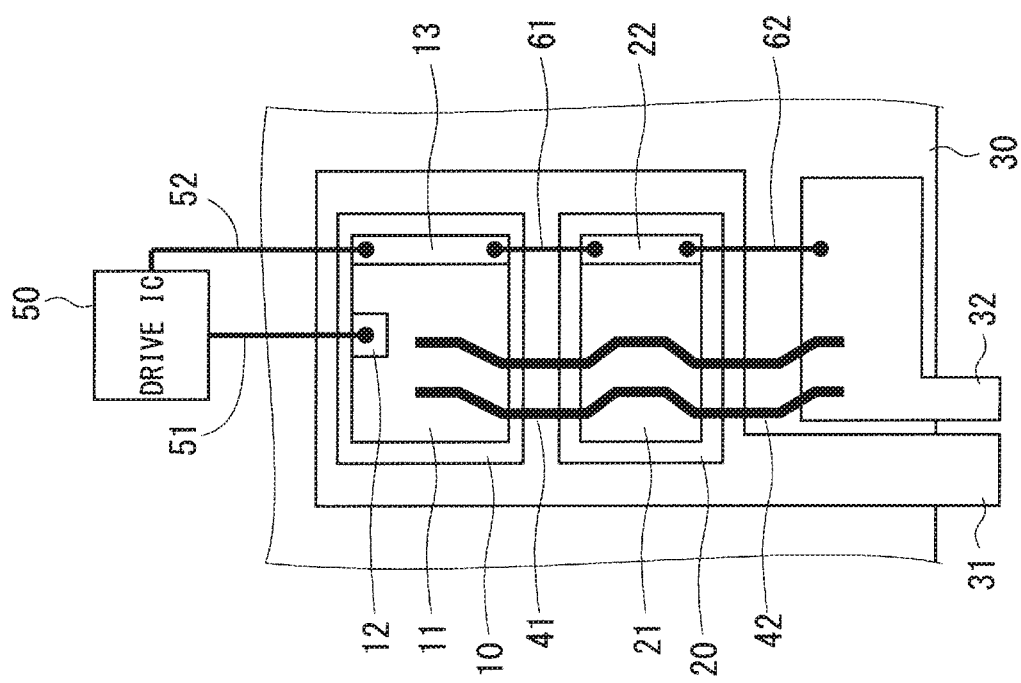

FIGS. 1A to 1C are diagrams each illustrating a configuration example of a power module which is a semiconductor device according to an embodiment 1. FIG. 1A is a plan view illustrating an internal structure of the power module, FIG. 1B is a side view illustrating the internal structure of the power module, and FIG. 1C is a circuit diagram illustrating a circuit configuration of the power module. Each of FIGS. 1A to 1C illustrates a part of the power module (for one arm) representatively, however, the power module actually includes one or a plurality of configurations illustrated in FIGS. 1A to 1C.

As illustrated in FIG. 1A and FIG. 1B, the power module according to the embodiment 1 is a transfer molding type power module having a structure that thin plate-like lead frames 31 and 32 made of metal and each chip of an IGBT 10 and a FWD 20 mounted on the lead frame 31 are sealed by a molding resin 30.

The IGBT 10 is a switching element switching on (conduction) and off (interruption) a main current. An emitter electrode 11 which is a first main electrode and a gate electrode 12 which is a control electrode are formed on an upper surface of the IGBT 10, and a collector electrode (not shown) which is a second main electrode is formed on a lower surface (a surface having contact with the lead frame 31) of the IGBT 10. Furthermore, a conductive pattern 13 (a first conductive pattern) insulated from the emitter electrode 11 and the gate electrode 12 is formed on the upper surface of the IGBT 10 according to the present embodiment.

The FWD 20 is a diode element flowing a reflux current occurring at a time of switch-off of the IGBT 10. An anode electrode 21 which is a first main electrode is formed on an upper surface of the FWD 20, and a cathode electrode (not shown) which is a second main electrode is formed on a lower surface (a surface having contact with the lead frame 31) of the FWD 20. Furthermore, a conductive pattern 22 (a second conductive pattern) insulated from the anode electrode 21 is formed on the upper surface of the FWD 20 according to the present embodiment.

The emitter electrode 11 in the IGBT 10 is connected to the anode electrode 21 in the FWD 20 via a wire 41, and the collector electrode in the IGBT 10 is connected to the cathode electrode in the FWD 20 via the lead frame 31. Thus, each of the IGBT 10 and the FWD 20 constitutes a parallel circuit parallelly connected to each other. The anode electrode 21 in the FWD 20 is connected to the lead frame 32 via the wire 42. The wires 41 and 42 are paths in which the main current flows when the IGBT 10 is switched on. The wires 41 and 42 are referred to as "the main current wire" hereinafter.

The lead frame 31 is a die pad mounting the IGBT 10 and FWD 20, and partially protrudes from the molding resin 30, thereby also functioning as an external connection terminal on a collector side of the IGBT 10. The lead frame 32 partially protrudes from the molding resin 30, thereby functioning as an external connection terminal on an emitter side of the IGBT 10.

Provided in the power module according to the present embodiment are a drive voltage wiring 51 for inputting a control voltage generated by a drive IC 50, which is a drive circuit of the IGBT 10, to the gate electrode 12 in the IGBT 10 and a reference potential wiring 52 for supplying reference potential to the drive IC 50. The drive IC 50 may be built in the power module or externally mounted on the power module. The drive voltage wiring 51 is connected to the gate electrode 12 in the IGBT 10. A connection destination of the reference potential wiring 52 is changed in accordance with an amount of negative feedback indicating an amount of a voltage drop in an emitter wiring in the IGBT 10 fed back to a gate.

In the example in FIG. 1A, the reference potential wiring 52 is connected to the conductive pattern 13 in the IGBT 10. The conductive pattern 13 is connected to the conductive pattern 22 in the FWD 20 via a wire 61, and the conductive pattern 22 is connected to the lead frame 32 via a wire 62. That is to say, the reference potential wiring 52 is connected to the lead frame 32 which is the external connection terminal on the emitter side via the conductive pattern 13 and the conductive pattern 22 serially connected to each other.

Thus, FIG. 1A has a circuit configuration that the main current wire 41 and the main current wire 42 serially connected to each other intervene between the emitter in the IGBT 10 and the reference potential wiring 52 as the circuit diagram in FIG. 1C. Thus, according to the configuration in FIG. 1A, a negative feedback effect using a voltage drop by a wiring impedance $Z_{41}$ of the main current wire 41 and a wiring impedance $Z_{42}$ of the main current wire 42 can be obtained.

Herein, there is also a case where the reference potential wiring 52 is not connected to the conductive pattern 13, but is connected to the emitter electrode 11 or an external wiring which is externally mounted on the power module in accordance with a necessary amount of negative feedback. There is also a case where the wire 61 does not connect the conductive pattern 13 and the conductive pattern 22, but connects the conductive pattern 13 and the anode electrode 21. A region where the reference potential wiring 52 can be connected is ensured separately from a connection region of the main current wire 41 in the emitter electrode 11, and a region where the wire 61 can be connected is ensured separately from a connection region of the main current wires 41 and 42 in the anode electrode 21.

Figure 2C:
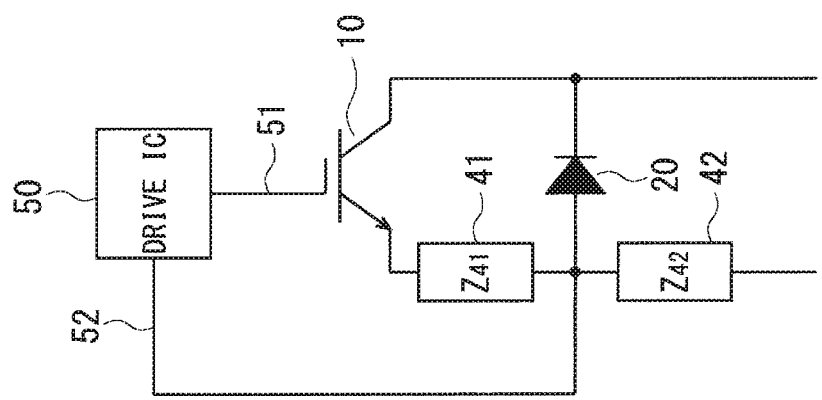
FIGS. 2A to 2C are diagrams each illustrating a configuration example of the power module according to the embodiment 1.
Figure 2B:
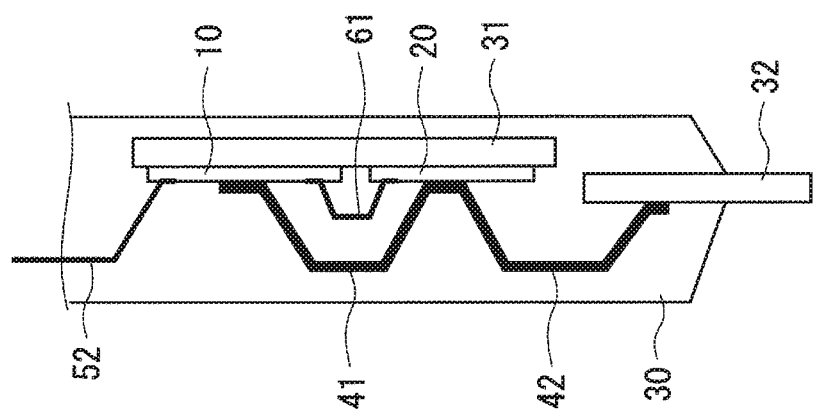
Figure 2A:
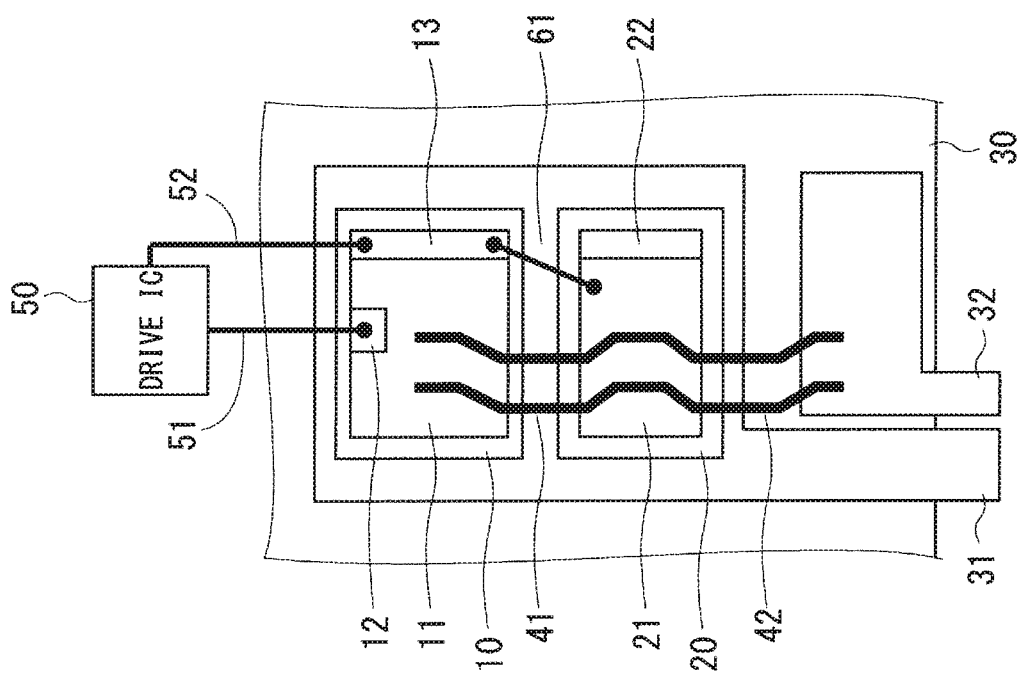

FIGS. 2A to 2C illustrate an example of obtaining the negative feedback effect using only the voltage drop by the wiring impedance $Z_{41}$ of the main current wire 41 in the power module according to the embodiment 1. FIG. 2A is a plan view illustrating an internal structure of the power module, FIG. 2B is a side view illustrating the internal structure of the power module, and FIG. 2C is a circuit diagram illustrating a circuit configuration of the power module. In this case, the reference potential wiring 52 is connected to the conductive pattern 13 in the IGBT 10, and the conductive pattern 13 is connected to the anode electrode 21 in the FWD 20 via the wire 61 (the wire 62 is unnecessary). Accordingly, made up is a circuit configuration as the circuit diagram in FIG. 2C that the main current wire 41 (the wiring impedance $Z_{41}$) intervenes between the emitter in the IGBT 10 and the reference potential wiring 52.

Figure 3C:
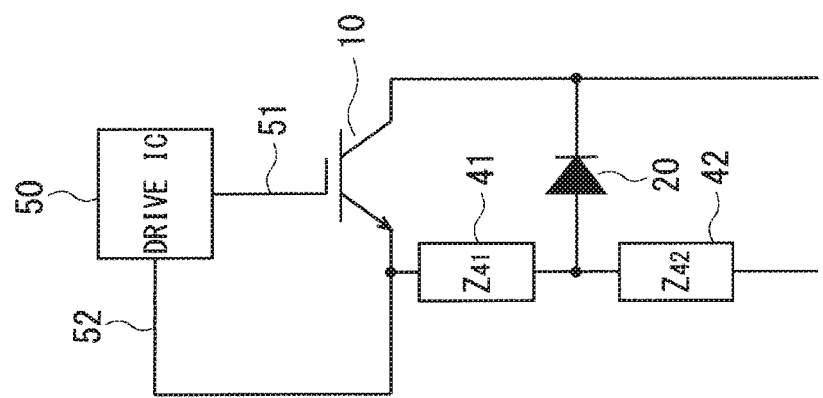
FIGS. 3A to 3C are diagrams each illustrating a configuration example of the power module according to the embodiment 1.
Figure 3B:
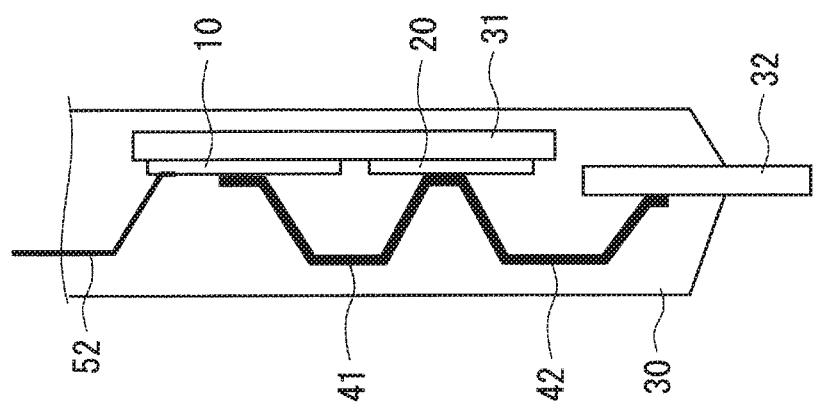
Figure 3A:
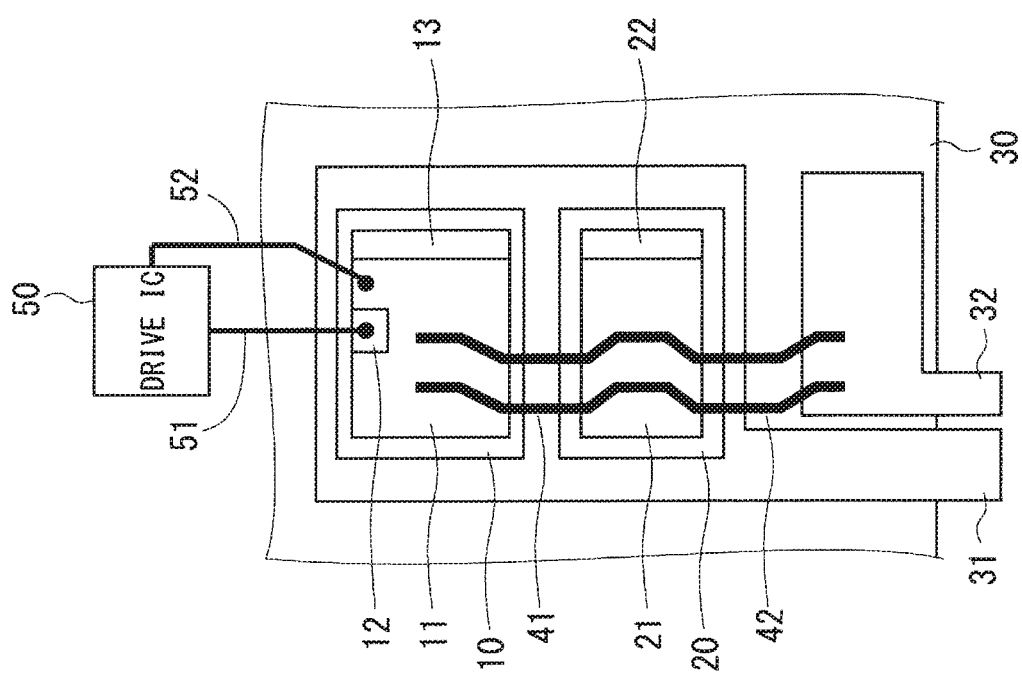

FIGS. 3A to 3C illustrate an example of not using the negative feedback effect in the power module according to the embodiment 1. FIG. 3A is a plan view illustrating an internal structure of the power module, FIG. 3B is a side view illustrating the internal structure of the power module, and FIG. 3C is a circuit diagram illustrating a circuit configuration of the power module. In this case, the reference potential wiring 52 is connected to the emitter electrode 11 in the IGBT 10 (the wires 61 and 62 are unnecessary). Accordingly, made up is a circuit configuration as the circuit diagram in FIG. 3C that the reference potential wiring 52 is directly connected to the emitter in the IGBT 10.

As described above, in the power module according to the embodiment 1, the connection destination of the reference potential wiring 52 is selected at a time of manufacturing the power module, thus a level of the negative feedback function using the wiring impedance of the emitter wiring can be adjusted.

When the reference potential wiring 52 is connected to the lead frame 32 as is the case in FIG. 1A, the connection is established via the conductive patterns 13 and 22, thus a length of the wires 61 and 62 necessary for the connection can be reduced. In the similar manner, when the reference potential wiring 52 is connected to the anode electrode 21 in the FWD 20 as is the case in FIG. 2A, the connection is established via the conductive pattern 13, thus a length of the wire 61 necessary for the connection can be reduced. Accordingly, the interference between the wires 61 and 62 and the main current wires 41 and 42 is prevented, thus the lead frame, for example, for preventing the interference between the wires needs not be separately provided. Thus, the above configuration can contribute to a downsizing of the package of the power module.

Figure 4:
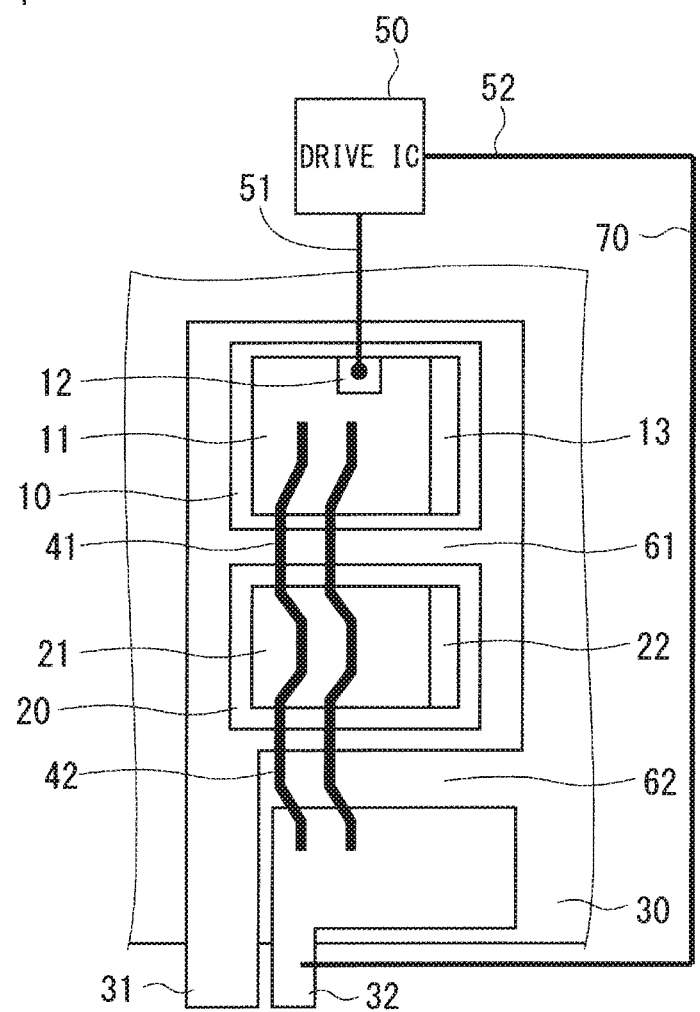
FIG. 4 is a diagram illustrating a configuration example of the power module according to the embodiment 1.

When obtained is the negative feedback effect using the voltage drop by the wiring impedance $Z_{41}$ of the main current wire 41 and the wiring impedance $Z_{42}$ of the main current wire 42 as the example illustrated in FIGS. 1A to 1C, the reference potential wiring 52 may be connected to the lead frame 32 as the external connection terminal via an external wiring 70 externally mounted on the power module as illustrated in FIG. 4, for example. In the configuration in FIG. 4, the conductive pattern 13 and the conductive pattern 22 are not used, however, the circuit configuration is the same as that in FIG. 1C.

Embodiment 2

An embodiment 2 describes a configuration that the power module includes a plurality of arms made up of a parallel circuit of the IGBT and the FWD. FIGS. 5A and 5B illustrate a configuration example thereof. FIG. 5A is a plan view illustrating an internal structure of the power module, and FIG. 5B is a circuit diagram illustrating a circuit configuration of the power module. FIGS. 5A and 5B illustrate a configuration for two arms (an upper arm and a lower arm) in the power module, however, the number of arms included in the power module may be three or more.

As illustrated in FIG. 5A, the power module according to the embodiment 2 is a transfer molding type power module having a structure that the lead frames 31, 32, and 33, an IGBT 10a and a FWD 20a mounted on the lead frame 31 to constitute the lower arm, and an IGBT 10b and a FWD 20b mounted on the lead frame 33 to constitute the upper arm are sealed by the molding resin 30.

An emitter electrode 11a, a gate electrode 12a, and a conductive pattern 13a insulated from the emitter electrode 11a and the gate electrode 12a are formed on an upper surface of the IGBT 10a, and a collector electrode (not shown) is formed on a lower surface (a surface having contact with the lead frame 31) of the IGBT 10a.

An anode electrode 21a and a conductive pattern 22a insulated from the anode electrode 21a are formed on an upper surface of the FWD 20a, and a cathode electrode (not shown) is formed on a lower surface of the FWD 20a.

The emitter electrode 11a in the IGBT 10a is connected to the anode electrode 21a in the FWD 20a via the main current wire 41a, and the collector electrode in the IGBT 10a is connected to the cathode electrode in the FWD 20a via the lead frame 31. Thus, each of the IGBT 10a and the FWD 20a constitutes a parallel circuit parallelly connected to each other. The anode electrode 21a in the FWD 20a is connected to the lead frame 32 via the main current wire 42a.

An emitter electrode 11b, a gate electrode 12b, and a conductive pattern 13b insulated from the emitter electrode 11b and the gate electrode 12b are formed on an upper surface of the IGBT 10b, and a collector electrode (not shown) is formed on a lower surface (a surface having contact with the lead frame 33) of the IGBT 10b.

An anode electrode 21b and a conductive pattern 22b insulated from the anode electrode 21b are formed on an upper surface of the FWD 20b, and a cathode electrode (not shown) is formed on a lower surface (a surface having contact with the lead frame 33) of the FWD 20b.

The emitter electrode 11b in the IGBT 10b is connected to the anode electrode 21b in the FWD 20b via a main current wire 41b, and the collector electrode in the IGBT 10b is connected to the cathode electrode in the FWD 20b via the lead frame 33. Thus, each of the IGBT 10b and the FWD 20b constitutes a parallel circuit parallelly connected to each other. The anode electrode 21b in the FWD 20b is connected to the lead frame 31 via the main current wire 41b.

Provided in the power module according to the present embodiment are a drive voltage wiring 51a for inputting a control voltage generated by a drive IC 50a for the lower arm to the gate electrode 12a in the IGBT 10a, a reference potential wiring 52a for supplying reference potential to the drive IC 50a, a drive voltage wiring 51b for inputting a control voltage generated by a drive IC 50b for the upper arm to the gate electrode 12b in the IGBT 10b, and a reference potential wiring 52b for supplying reference potential to the drive IC 50b. The drive ICs 50a and 50b may be built in the power module or externally mounted on the power module.

The drive voltage wiring 51a is connected to the gate electrode 12 in the IGBT 10, and the drive voltage wiring 51b is connected to the gate electrode 12b in the IGBT 10b. A connection destination of the reference potential wiring 52a is changed in accordance with an amount of negative feedback indicating an amount of a voltage drop in an emitter wiring in the IGBT 10a fed back to a gate of the IGBT 10a. In the similar manner, a connection destination of the reference potential wiring 52b is changed in accordance with an amount of negative feedback indicating an amount of a voltage drop in an emitter wiring in the IGBT 10b fed back to a gate of the IGBT 10b.

In the power module according to the embodiment 2, the amount of negative feedback can be adjusted for each arm (the parallel circuit of the IGBT and the FWD). That is to say, the reference potential wiring needs to be electrically connected to the emitter electrode in the IGBT for each of the plurality of arms by any one of methods of: (a) being directly connected to the emitter electrode in the IGBT; (b) being connected to the anode electrode in the FWD via the conductive pattern (the first conductive pattern) on the IGBT; (c) being connected to the external connection terminal via the conductive pattern (the first conductive pattern) on the IGBT and the conductive pattern (the second conductive pattern) on the FWD; and (d) being connected to the external connection terminal via the external wiring.

In the example in FIGS. 5A and 5B, the reference potential wiring 52a of the drive IC 50a is connected to the lead frame 32 via an external wiring 70a in the lower arm, thus obtained is the negative feedback effect using the voltage drop by a wiring impedance $Z_{41a}$ of the main current wire 41a and a wiring impedance $Z_{42a}$ of the main current wire 42. The reference potential wiring 52b of the drive IC 50b is connected to the lead frame 31 via conductive patterns 13b and 22b and wires 61b and 62b in the upper arm, thus obtained is the negative feedback effect using the voltage drop by a wiring impedance $Z_{41b}$ of the main current wire 41b and a wiring impedance $Z_{42b}$ of the main current wire 42b.

The embodiments described above describe the example that the IGBT is used as the switching element, however, the switching element is not limited thereto, thus a MOSFET is also applicable. A wide-gap semiconductor of Silicone (Si), SiC, GaN, for example, may be used as a material of the switching element and the FWD. The switching element and the diode element made up of the wide-gap semiconductor have high withstand voltage characteristics and a high allowable current density. Thus, the switching element and the FWD are made up of the wide-gap semiconductor, thereby being able to contribute to the further downsizing of the power module.

According to the present invention, each embodiment can be arbitrarily combined, or each embodiment can be appropriately varied or omitted within the scope of the invention.

What is claimed is:

1. A semiconductor device, comprising:
   a switching element;
   a free wheel diode parallelly connected to the switching element; and a reference potential wiring for supplying reference potential to a drive circuit which inputs a control voltage to a control electrode of the switching element, wherein the switching element has a first conductive pattern insulated from a main electrode and the control electrode of the switching element on an upper surface of the switching element, both the first conductive pattern and the main electrode of the switching element being positioned on the upper surface of the switching element, the free wheel diode has a second conductive pattern insulated from a main electrode of the free wheel diode on a surface of the free wheel diode, and the first conductive pattern is connected to the reference potential wiring.

2. A semiconductor device, comprising:
a switching element;
a free wheel diode parallelly connected to the switching element;
a first wire connecting a main electrode of the switching element and a main electrode of the free wheel diode;
a second wire connecting the main electrode of the free wheel diode and an external connection terminal; and
a reference potential wiring for supplying reference potential to a drive circuit which inputs a control voltage to a control electrode of the switching element, wherein the switching element has a first conductive pattern insulated from the main electrode and the control electrode of the switching element on a surface of the switching element, and the free wheel diode has a second conductive pattern insulated from the main electrode of the free wheel diode on a surface of the free wheel diode.

3. The semiconductor device according to claim 2, wherein
the reference potential wiring is connected to the main electrode of the free wheel diode via the first conductive pattern.

4. The semiconductor device according to claim 2, wherein
the reference potential wiring is connected to the external connection terminal via the first conductive pattern and the second conductive pattern serially connected to each other.

5. A semiconductor device, comprising:
a switching element;
a free wheel diode parallelly connected to the switching element; and
a plurality of parallel circuits each made up of the switching element and the free wheel diode, wherein
the switching element has a first conductive pattern insulated from a main electrode and a control electrode of the switching element on a surface of the switching element, the free wheel diode has a second conductive pattern insulated from a main electrode of the free wheel diode on a surface of the free wheel diode, each of the plurality of parallel circuits includes:
a first wire connecting the main electrode of the switching element and the main electrode of the free wheel diode;
a second wire connecting the main electrode of the free wheel diode and an external connection terminal; and
a reference potential wiring for supplying reference potential to a drive circuit which inputs a control voltage to the control electrode of the switching element, and the reference potential wiring is electrically connected to the main electrode of the switching element in each of the plurality of parallel circuits by any one of methods of:
(a) being directly connected to the main electrode of the switching element;
(b) being connected to the main electrode of the free wheel diode via the first conductive pattern;
(c) being connected to the external connection terminal via the first conductive pattern and the second conductive pattern; and
(d) being connected to the external connection terminal via an external wiring.

6. The semiconductor device according to claim 1, comprising
a transfer molding type package.

7. The semiconductor device according to claim 1, wherein
the switching element is formed using a wide-gap semiconductor.

8. The semiconductor device according to claim 1, wherein
the switching element is an IGBT or a MOSFET.

9. A semiconductor device, comprising:
a switching element; and
a free wheel diode parallelly connected to the switching element, wherein the switching element has a first conductive pattern insulated from a main electrode and a control electrode of the switching element on an upper surface of the switching element, both the first conductive pattern and the main electrode of the switching element being positioned on the upper surface of the switching element, the free wheel diode has a second conductive pattern insulated from a main electrode of the free wheel diode on a surface of the free wheel diode, and the first conductive pattern is connected by a wire to the second conductive pattern to form a continuous electrical path across both the switching element and the free wheel diode.

* * * * *